(12) United States Patent
Imai et al.

(10) Patent No.: US 12,541,153 B2
(45) Date of Patent: Feb. 3, 2026

(54) EXPOSURE APPARATUS, EXPOSURE METHOD AND ARTICLE MANUFACTURING METHOD

(71) Applicant: CANON KABUSHIKI KAISHA, Tokyo (JP)

(72) Inventors: Masaki Imai, Saitama (JP); Mamoru Kaneishi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 153 days.

(21) Appl. No.: 18/360,238

(22) Filed: Jul. 27, 2023

(65) Prior Publication Data

US 2024/0053686 A1   Feb. 15, 2024

(30) Foreign Application Priority Data

Aug. 10, 2022   (JP) ................ 2022-128386

(51) Int. Cl.
*G03F 7/00*   (2006.01)

(52) U.S. Cl.
CPC ...... *G03F 7/70358* (2013.01); *G03F 7/70725* (2013.01); *G03F 7/70775* (2013.01)

(58) Field of Classification Search
CPC ............ G03F 7/70358; G03F 7/70525; G03F 7/70725; G03F 7/70775; G03F 7/70433;

(Continued)

(56) References Cited

U.S. PATENT DOCUMENTS 5,617,182 A    4/1997  Wakamoto et al.
5,995,203 A *  11/1999  Ueda ............... G03F 7/70558
                                        355/53

(Continued)

FOREIGN PATENT DOCUMENTS

EP     1037114 B1    1/2006
JP     2000100721 A  4/2000

(Continued)

OTHER PUBLICATIONS

Machine translation of JP-2004260116-A (Year: 2004).*

(Continued)

*Primary Examiner* — Steven H Whitesell
(74) *Attorney, Agent, or Firm* — ROSSI, KIMMS & McDOWELL LLP (57) ABSTRACT

An exposure apparatus for exposing a plurality of shot regions on a substrate, including a stage configured to hold and drive the substrate, and a control unit configured to control driving of the stage based on a driving profile that defines the driving of the stage, wherein the driving profile is formed by connecting a first acceleration profile that controls acceleration/deceleration of the stage in a non-exposure section that does not include an exposure section where the shot region is exposed and a second acceleration profile that controls the acceleration/deceleration of the stage in the exposure section, the second acceleration profile is formed by a curve, and the control unit determines the first acceleration profile and the second acceleration profile for each of the plurality of shot regions based on information about a size of the shot region.

15 Claims, 10 Drawing Sheets

(58) Field of Classification Search
CPC ........ G05B 19/416; G05B 2219/45028; G05B 2219/45031; G05B 2219/43033
See application file for complete search history.

(56) References Cited

U.S. PATENT DOCUMENTS

| | | | |
|---|---|---|---|
| 9,158,211 B2 | 10/2015 | Emoto et al. | |
| 2010/0060872 A1* | 3/2010 | Takano | G03B 27/54 355/53 |
| 2012/0170008 A1* | 7/2012 | Emoto | G03F 7/70725 355/53 |
| 2014/0307235 A1* | 10/2014 | Sato | G03F 7/70866 355/30 |
| 2023/0013155 A1* | 1/2023 | Emoto | G03F 7/70725 |

FOREIGN PATENT DOCUMENTS

| | | | |
|---|---|---|---|
| JP | 2004260116 A | * | 9/2004 |
| JP | 2010286927 A | | 12/2010 |
| JP | 5406861 B2 | | 2/2014 |
| KR | 1020120079009 A | | 7/2012 |

OTHER PUBLICATIONS

Extended European search report issued in European Appln. No. 23187836.4, mailed on Jan. 4, 2024.
Notice of Allowance issued in Korean Appln. No. 10-2023-0094489 dated Jan. 14, 2025. English translation provided.
Office Action issued in Taiwanese Application No. 112128098 dated Oct. 14, 2025.

* cited by examiner

EXPOSURE APPARATUS, EXPOSURE METHOD AND ARTICLE MANUFACTURING METHOD

BACKGROUND OF THE INVENTION

Field of the Invention

The present invention relates to an exposure apparatus, an exposure method and an article manufacturing method.

Description of the Related Art

In a lithography step of manufacturing a device such as a semiconductor element, an exposure apparatus that transfers the pattern of an original (a reticle or a mask) to a substrate via a projection optical system is used. As such an exposure apparatus, there is known a scanning exposure apparatus that employs a so-called step-and-scan method in which the pattern of an original is transferred to a substrate by exposing (scanning and exposing) the substrate while relatively scanning the original and the substrate.

The scanning exposure apparatus generally performs scanning exposure of a substrate while driving the substrate at a constant speed. Japanese Patent No. 5406861 proposes performing scanning exposure of a substrate while accelerating/decelerating (accelerating or decelerating) the substrate and driving it. Japanese Patent No. 5406861 discloses a technique of scanning and exposing a substrate while accelerating/decelerating a stage holding the substrate in accordance with a driving (acceleration) profile formed by a sine wave, thereby shortening the driving time of the stage (substrate) and improving productivity (throughput).

In the conventional technique, however, the driving profile is not changed for each shot region regardless of the shot layout on a substrate (the array of shot regions on a substrate). In the conventional technique, as a driving profile common to a plurality of shot regions on a substrate, a driving profile optimum for scanning exposure of a shot region with the largest shot size is set.

SUMMARY OF THE INVENTION

The present invention provides an exposure apparatus advantageous in improving productivity.

According to one aspect of the present invention, there is provided an exposure apparatus for exposing a plurality of shot regions on a substrate while scanning an original and the substrate, including a stage configured to hold and drive the substrate, and a control unit configured to control driving of the stage based on a driving profile that defines the driving of the stage, wherein the driving profile is formed by connecting a first acceleration profile that controls acceleration/deceleration of the stage in a non-exposure section that does not include an exposure section where the shot region is exposed and a second acceleration profile that controls the acceleration/deceleration of the stage in the exposure section, the second acceleration profile is formed by a curve, and the control unit determines the first acceleration profile and the second acceleration profile for each of the plurality of shot regions based on information about a size of the shot region.

Further aspects of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
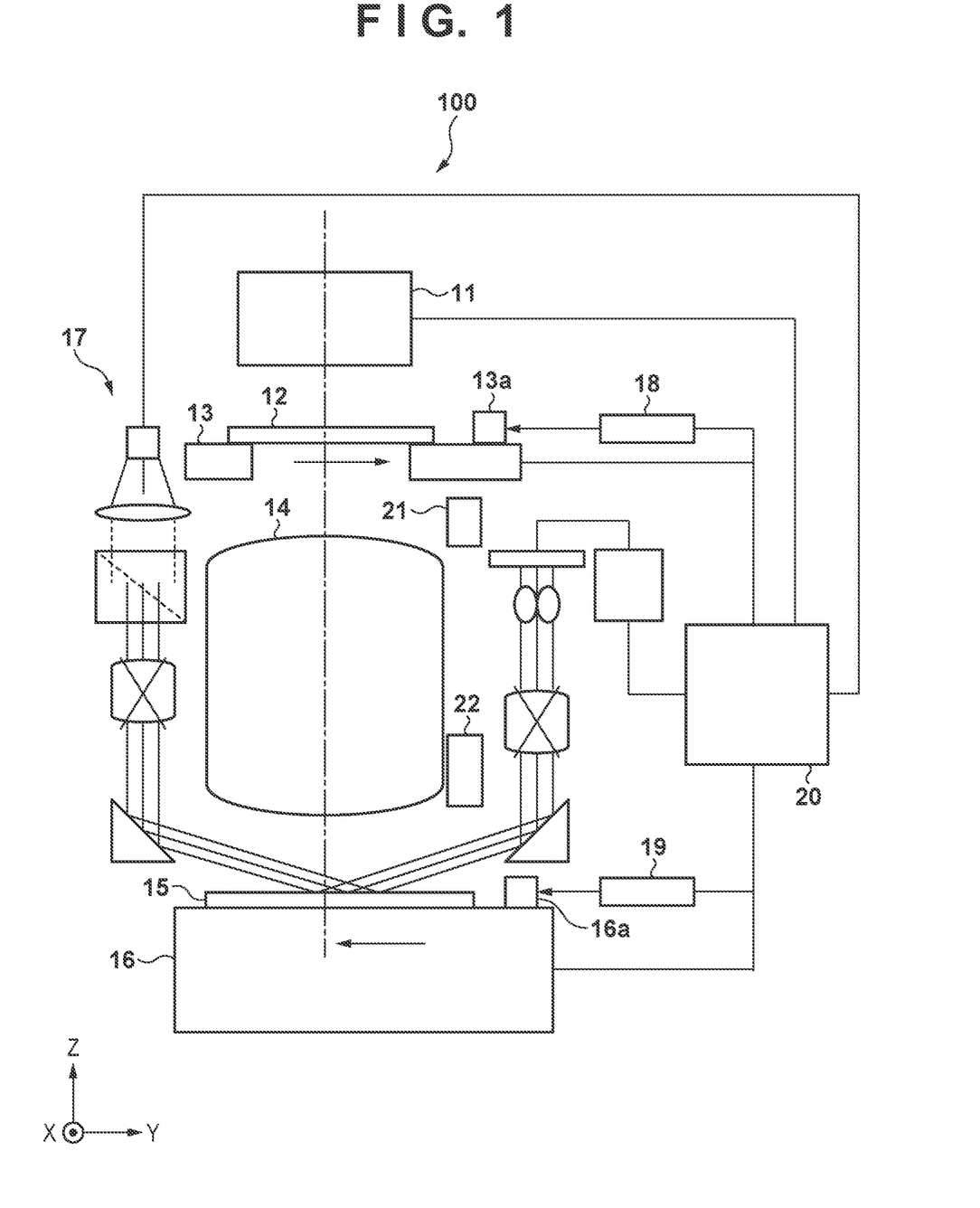
FIG. 1 is a schematic view illustrating configurations of an exposure apparatus according to an embodiment of the present invention.

FIG. 1 is a schematic view illustrating configurations of an exposure apparatus 100 according to an embodiment of the present invention. The exposure apparatus 100 is a lithography apparatus that is used in a lithography step as a manufacturing step of a device such as a semiconductor element and forms a pattern on a substrate using an original (a reticle or a mask). The exposure apparatus 100 is a scanning exposure apparatus (scanner) that employs a step-and-scan method in which the pattern of an original is transferred to a substrate by exposing (scanning and exposing) the substrate while relatively scanning the original and the substrate.

In this specification and attached drawings, a direction is indicated on an XYZ coordinate system in which a direction along the optical axis of a projection optical system 14 to be described later is defined as a Z-axis, and two directions that are perpendicular to each other and parallel to a plane perpendicular to the Z-axis are defined as X- and Y-axes. In addition, directions parallel to the X-, Y-, and Z-axes in the XYZ coordinate system are defined as X, Y, and Z directions, respectively. The Z direction will sometimes be referred to as a height direction hereinafter. Note that in this embodiment, the direction (scanning direction) to relatively scan an original and a substrate is the Y direction (+Y direction or −Y direction).

As shown in FIG. 1, the exposure apparatus 100 includes an illumination optical system 11, an original stage 13 that holds an original 12, the projection optical system 14, and a substrate stage 16 that holds a substrate 15. The exposure apparatus 100 also includes a surface position measurement unit 17, a first measurement unit 18, a second measurement unit 19, a control unit 20, an original detection unit 21, and a substrate detection unit 22.

The control unit 20 is formed by, for example, a computer (information processing apparatus) including a processor such as a CPU and a memory, and comprehensively controls each unit of the exposure apparatus 100 in accordance with a program stored in a storage unit. In this embodiment, the control unit 20 controls processing of transferring the pattern of the original 12 to the substrate 15 while relatively scanning the original 12 and the substrate 15, that is, scanning exposure of the substrate 15.

The illumination optical system 11 includes a light shielding member such as a masking blade, shapes light emitted from a light source (not shown) such as an excimer laser into, for example, a band-shaped or arc light (slit light) having a longitudinal direction in the X direction, and illuminates a part of the original 12 with the light.

The original 12 and the substrate 15 are held by the original stage 13 and the substrate stage 16, respectively, and arranged at optically conjugate positions (the object plane and the image plane of the projection optical system 14) with the projection optical system 14 intervening therebetween.

The projection optical system 14 has a predetermined magnification (for example, ×½ or ×¼) and projects the pattern formed on the original 12 to the substrate 15. A region of the substrate 15 where the pattern of the original 12 is projected (that is, a region irradiated with the slit light) will be referred to as an exposure slit hereinafter.

The original stage 13 and the substrate stage 16 are configured to be driven in a direction (for example, the Y direction) perpendicular to the optical axis of the projection optical system 14 (the optical axis of the slit light). The original stage 13 and the substrate stage 16 are driven (scanned) in synchronism relatively at a speed ratio according to the projection magnification of the projection optical system 14. It is therefore possible to scan the exposure slit on the substrate and transfer the pattern of the original 12 to (the shot region of) the substrate 15. Such scanning exposure is repeated sequentially for a plurality of shot regions on the substrate, thereby completing exposure processing for one substrate 15.

The first measurement unit 18 includes, for example, a laser interferometer and measures the position of the original stage 13. The laser interferometer included in the first measurement unit 18, for example, irradiates a reflecting plate 13a provided on the original stage 13 with a laser beam, and detects the laser beam reflected by the reflecting plate 13a, thereby measuring a displacement from a reference position on the original stage 13. The first measurement unit 18 can acquire the current position of the original stage 13 based on the displacement from the reference position on the original stage 13.

The second measurement unit 19 includes, for example, a laser interferometer and measures the position of the substrate stage 16. The laser interferometer included in the second measurement unit 19, for example, irradiates a reflecting plate 16a provided on the substrate stage 16 with a laser beam, and detects the laser beam reflected by the reflecting plate 16a, thereby measuring a displacement from a reference position on the substrate stage 16. The second measurement unit 19 can acquire the current position of the substrate stage 16 based on the displacement from the reference position on the substrate stage 16.

Based on the current position of the original stage 13 acquired by the first measurement unit 18 and the current position of the substrate stage 16 acquired by the second measurement unit 19, the control unit 20 controls driving of the original stage 13 and the substrate stage 16 concerning the X and Y directions. Note that in this embodiment, the first measurement unit 18 and the second measurement unit 19 each use a laser interferometer to measure the position of the original stage 13 and the position of the substrate stage 16. However, the present invention is not limited to this, and, for example, an encoder may be used.

The surface position measurement unit 17 includes, for example, a light projection unit that projects light to the surface of the substrate 15, and a light receiving unit that receives the light reflected by the surface of the substrate 15, and measures the height (Z-direction position) of the surface of the substrate 15.

The original detection unit 21 detects an alignment mark provided on the original 12 and an alignment mark provided on the original stage 13. The control unit 20 calculates the relative positions of the alignment marks detected by the original detection unit 21, thereby obtaining a position deviation (position deviation amount) of the original 12 with respect to the original stage 13. When a plurality of alignment marks are provided in the X direction on each of the original 12 and the original stage 13, the position deviation of the original 12 with respect to the original stage 13 in the X, Y, and θ directions can be obtained.

The substrate detection unit 22 detects a plurality of alignment marks provided on a sample shot region in the plurality of shot regions on the substrate. The control unit 20 performs calculation processing of the detection result of the substrate detection unit 22, thereby obtaining the array information (shot layout) of the plurality of shot regions on the substrate.

In this embodiment, each of the original detection unit 21 and the substrate detection unit 22 is configured as an off-axis system that detects each mark without intervention of the projection optical system 14. However, the present invention is not limited to this. For example, each of the original detection unit 21 and the substrate detection unit 22 may be configured as a Through The Lens (TTL) system that detects each mark via the projection optical system 14.

Figure 2:
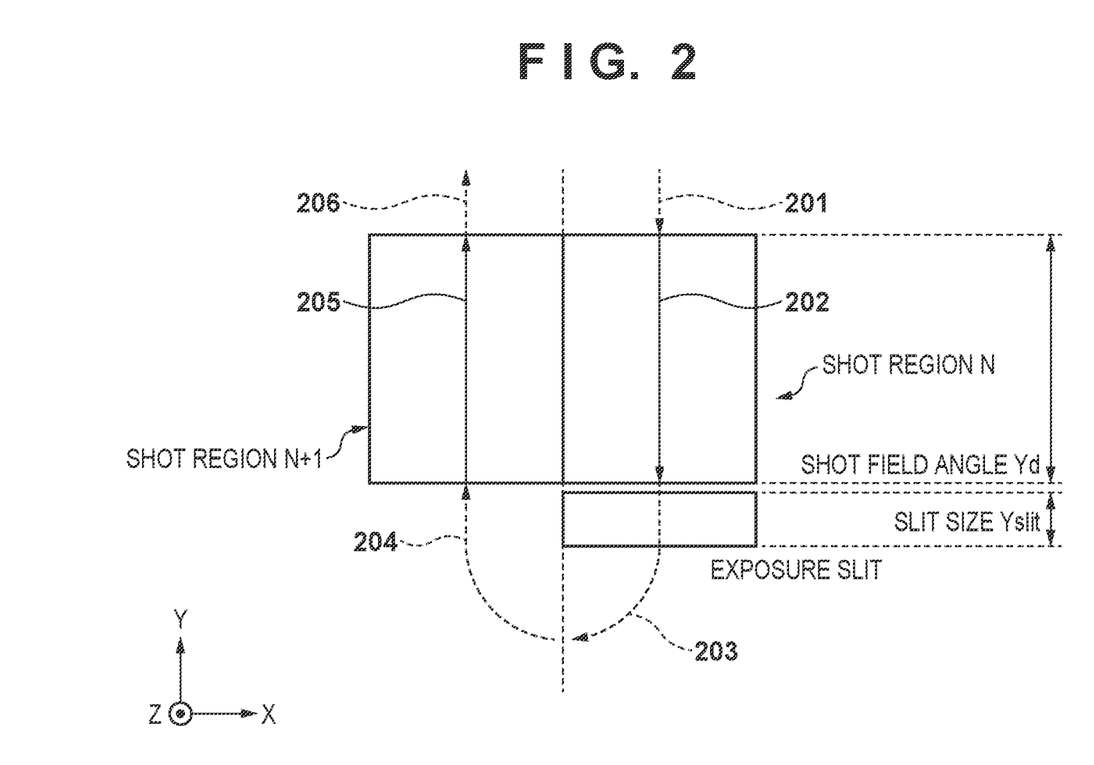
FIG. 2 is a view showing the moving locus of an exposure slit in a case where scanning exposure is performed in accordance with a conventional driving profile.
Figure 3:
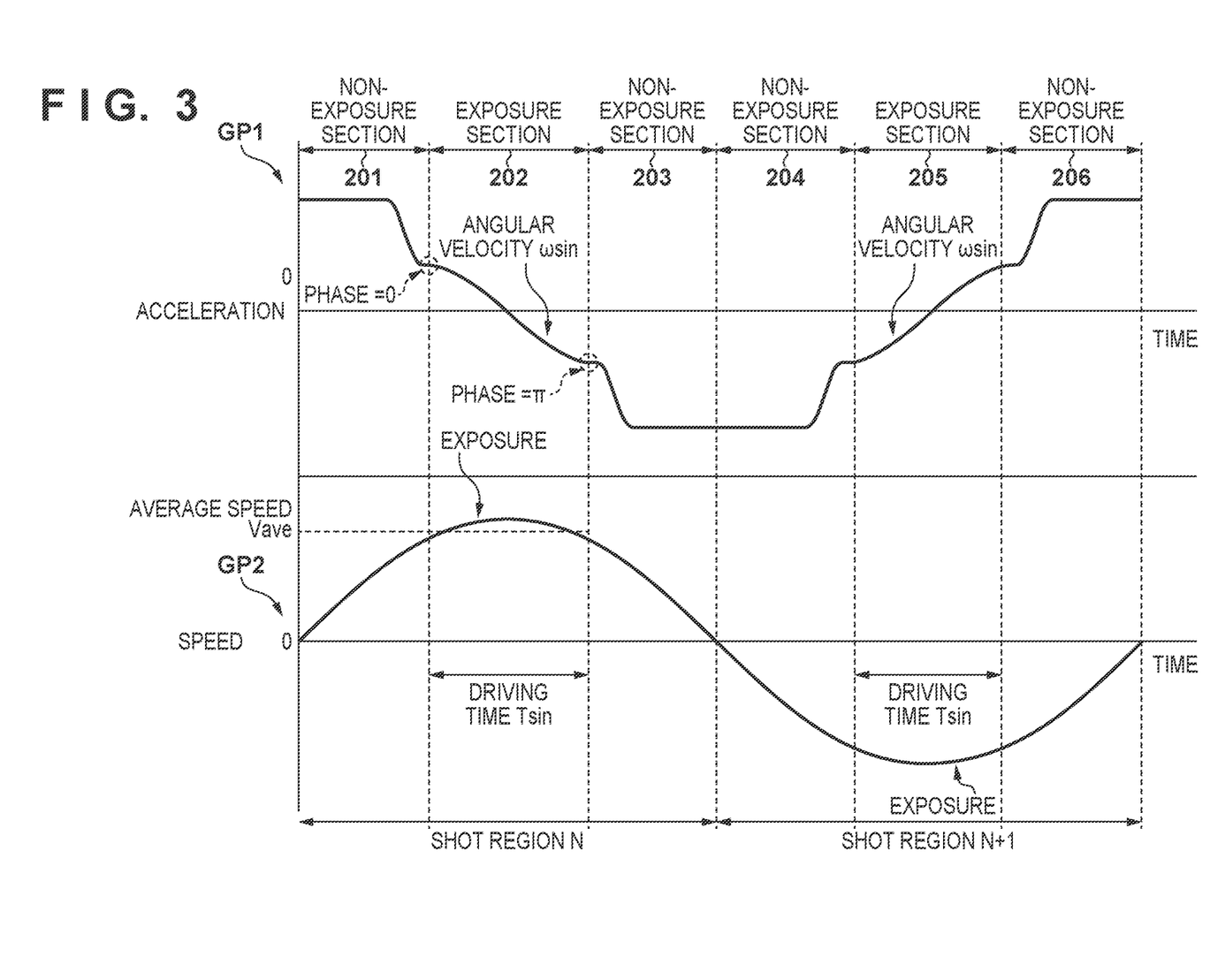
FIG. 3 is a view showing an example of the driving profile of a substrate stage in correspondence with the moving locus shown in FIG. 2.

Here, the driving profile of the substrate stage 16 for implementing performing scanning exposure of the substrate 15 while accelerating/decelerating (accelerating or decelerating) the substrate 15 and driving it will be described with reference to FIGS. 2 and 3. The driving profile is used by the control unit 20 to control driving of the substrate stage 16. FIG. 2 is a view showing the moving locus of the exposure slit that moves relatively on the substrate 15 in a case where the substrate stage 16 is driven in accordance with a conventional driving profile. FIG. 3 is a view showing an example of the driving profile of the substrate stage 16 in correspondence with the moving locus of the exposure slit shown in FIG. 2. In FIG. 3, a graph GP1 (a graph on the upper side) shows an acceleration profile of the substrate stage 16, showing the time-series change of the acceleration of the substrate stage 16 in the Y direction. Also, in FIG. 3, a graph GP2 (a graph on the lower side) shows a speed profile of the substrate stage 16, showing the time-series change of the speed of the substrate stage 16 in the Y direction.

When performing scanning exposure of a shot region N that is an exposure target, in a non-exposure section 201, the speed of the substrate stage 16 is increased up to a desired speed. The non-exposure section 201 includes a constant acceleration section, and a section where the acceleration is changed up to the desired acceleration using a function of a first order or higher, and is formed by a combination of two driving profiles corresponding to these. In the non-exposure section 201, the substrate stage 16 is accelerated at an acceleration higher than the start acceleration of an exposure section 202, thereby shortening the time until the substrate stage 16 is accelerated to the desired speed.

In the exposure section 202, scanning exposure of the shot region N is performed while driving the substrate stage 16 based on an acceleration profile formed by a part of a sine wave, more specifically, a half period (a phase of 0 to π) of a sine wave. After that, the exposure section 202 is connected to a non-exposure section 203. Hence, the phase at which the driving profile in the exposure section 202 and the driving profile in the non-exposure section 203 are connected is 0 or π. An angular velocity ω sin of the driving profile in the exposure section 202 (the driving profile formed by a part of a sine wave) is calculated by phase π/driving time T sin of substrate stage 16 in exposure section 202. The driving time T sin is calculated by (shot field angle Yd of shot region N+slit size Yslit of exposure slit)/average speed Vave of substrate stage 16 in exposure section 202. Note that a settling time of the substrate stage 16 (a standby time until the deviation of the substrate stage 16 converges) may be provided in the exposure section 202, and scanning exposure of the shot region N may be performed in a partial section of the exposure section 202. When the start acceleration of the exposure section 202 is changed, the speed change rate of the substrate stage 16 during scanning exposure can arbitrarily be set.

The irradiation (integrated) exposure amount of light (exposure light) emitted from the light source (not shown) to irradiate the substrate 15 need to always be constant. Hence, scanning exposure of the shot region N is performed while changing the exposure amount in accordance with the speed change of the substrate stage 16. For example, the exposure amount is controlled such that the exposure amount is increased in a case where the speed of the substrate stage 16 is high, and the exposure amount is decreased in a case where the speed of the substrate stage 16 is low.

In the non-exposure section 203, the substrate stage 16 is step-driven in the X direction to perform scanning exposure of a shot region N+1 that is the next exposure target while decelerating the substrate stage 16 based on a driving profile that is the same as in the non-exposure section 201 except that the sign is inverted. In a non-exposure section 204, an exposure section 205, and a non-exposure section 206, the substrate stage 16 is driven based on driving profiles that are the same as in non-exposure section 203, the exposure section 202, and the non-exposure section 201 except that the sign is inverted. Thus, as shown in FIG. 2, scanning exposure can continuously be performed for the shot region N and the shot region N+1.

In the conventional technique, as a driving profile common to a plurality of shot regions on a substrate, a driving profile optimum for scanning exposure of a shot region with the largest shot size is set regardless of the shot layout on the substrate 15. Here, the shot region with the largest shot size is normally a full field shot region located inside the periphery of the substrate 15. However, the plurality of shot regions on the substrate include not only full field shot regions but also peripheral shot regions located on the periphery of the substrate 15. The peripheral shot regions are partial field shot regions each having a partially missing part and therefore have various shot sizes. It is therefore considered that if an optimum driving profile is determined (set) for each shot region on the substrate, productivity (throughput) can further be improved.

In this embodiment, an optimum driving profile is determined for each shot region on a substrate, as will be described in the first to third embodiments below, thereby further improving productivity in a case where scanning exposure of the substrate 15 is performed while accelerating/decelerating the substrate 15.

First Embodiment

A method of determining an optimum driving profile for each shot region on a substrate in the first embodiment will be described with reference to FIGS. 4, 5A, 5B, and 6. A driving profile is a profile that defines driving of a substrate stage 16, and includes, for example, various kinds of profiles that control the speed, the acceleration, the position, and the like of the substrate stage 16. Here, an acceleration profile that controls the acceleration/deceleration of the substrate stage 16 will be described as a driving profile. The driving profile is formed by connecting a first driving profile in a non-exposure section that does not include an exposure section where a shot region is exposed, and a second driving profile in the exposure section. The first driving profile is an acceleration profile (first acceleration profile) that controls the acceleration/deceleration of the substrate stage 16 in the non-exposure section. The second driving profile is an acceleration profile (second acceleration profile) that controls the acceleration/deceleration of the substrate stage 16 in the exposure section.

Figure 4:
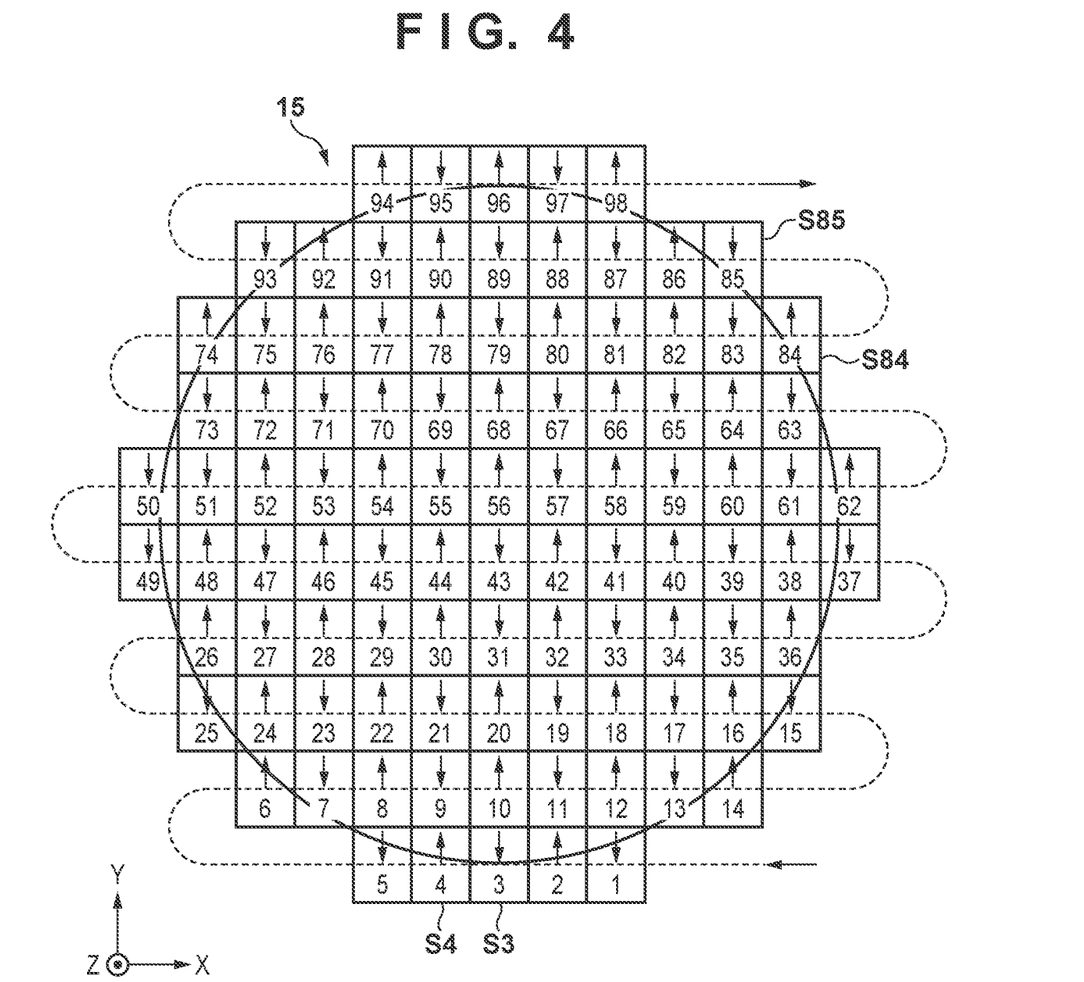
FIG. 4 is a view showing an example of a shot layout on a substrate.

FIG. 4 is a view showing an example of the shot layout on the substrate 15. As shown in FIG. 4, for example, 98 shot regions are arrayed on the substrate 15. A number in each shot region is a shot number, and scanning exposure of the shot regions is performed in the order of shot numbers (dotted line). Also, an arrow in each shot region represents a scanning direction.

Figures 5A, 5B:
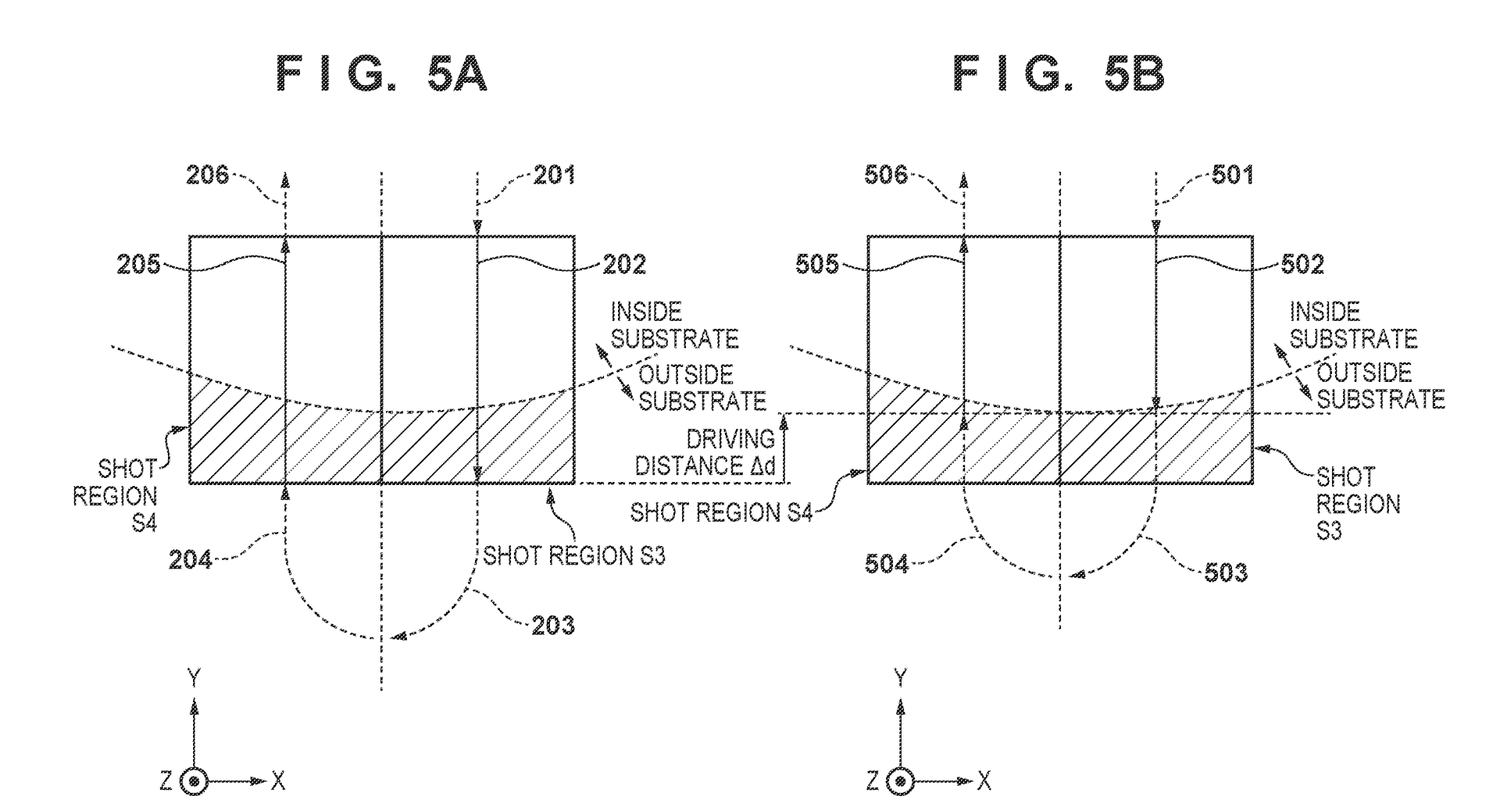
FIGS. 5A and 5B are views showing moving loci of an exposure slit.
Figure 6:
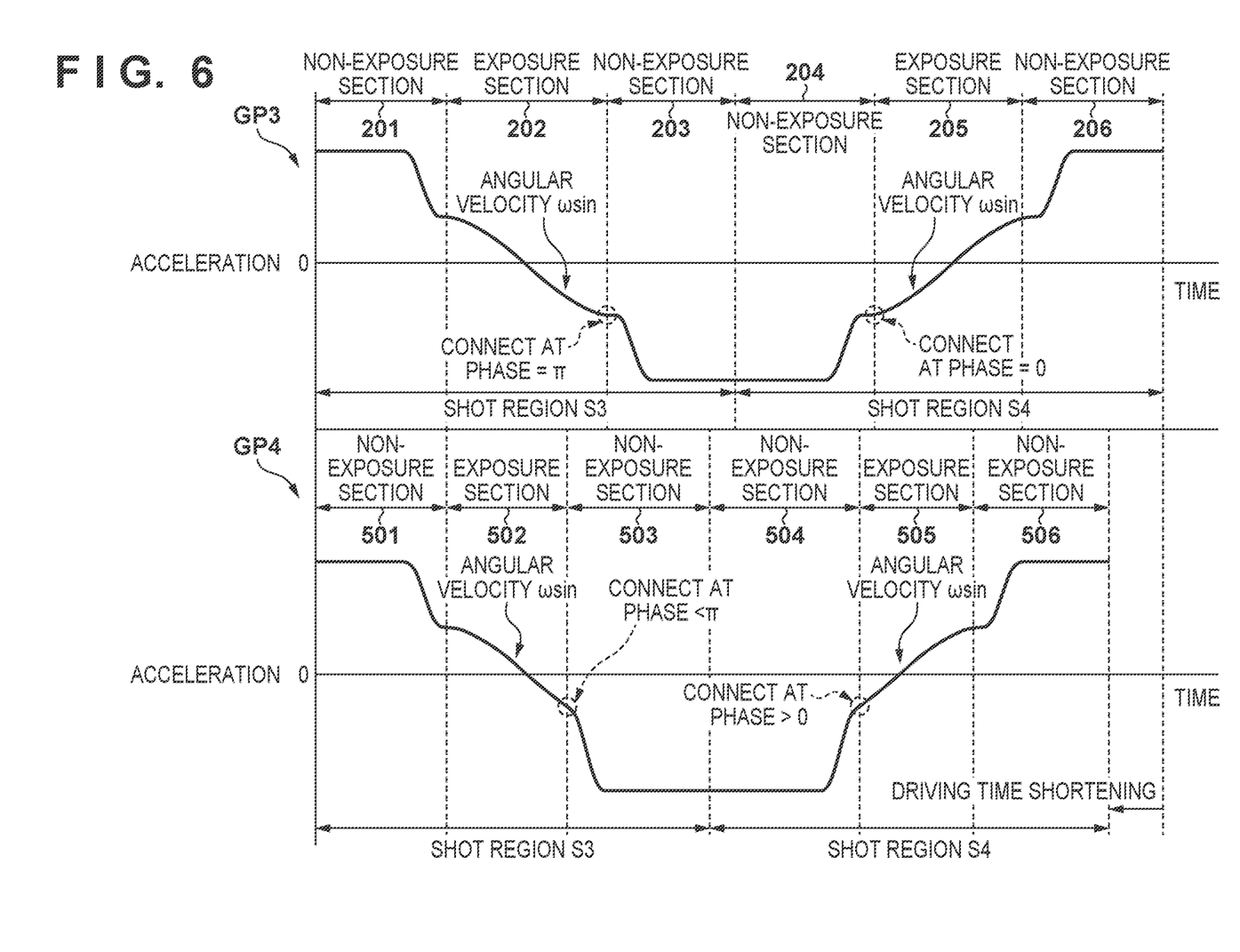
FIG. 6 is a view showing examples of the driving profile of a substrate stage.

In this embodiment, focus is placed on a shot region S3 of shot number 3 and a shot region S4 of shot number 4. Since the shot regions S3 and S4 are partial field shot regions (peripheral shot regions) with partial regions located outside the substrate, it is unnecessary to perform scanning exposure of the whole region, like a full field shot region. Hence, in the shot regions S3 and S4, as shown in FIGS. 5A and 5B, there is room to shorten the driving distance of the substrate stage 16 in the exposure section by a driving distance Δd. FIG. 5A is a view showing the moving locus of an exposure slit that moves relatively on the substrate 15 in a case where the substrate stage 16 is driven based on a conventional driving profile (a driving profile common to all shot regions) with focus placed on the shot regions S3 and S4. FIG. 5B is a view showing the moving locus of an exposure slit that moves relatively on the substrate 15 in a case where the substrate stage 16 is driven based on a driving profile determined from (information about) the sizes of the shot regions S3 and S4 in this embodiment. FIG. 6 is a view showing examples of the driving profile of the substrate stage 16 in correspondence with the moving loci shown in FIGS. 5A and 5B. In FIG. 6, a graph GP3 (a graph on the upper side) shows a driving profile (acceleration profile) corresponding to the moving locus shown in FIG. 5A, and a graph GP4 (a graph on the lower side) shows a driving profile (acceleration profile) corresponding to the moving locus shown in FIG. 5B.

Consider a case where scanning exposure of the shot regions S3 and S4 is performed while driving the substrate stage 16 based on the conventional driving profile (graph GP3). In this case, driving profiles in exposure sections 202 and 205 are the same as the driving profiles when performing scanning exposure of the shot region (full field shot region) having the largest shot size. However, when performing scanning exposure of the shot regions S3 and S4, driving of the substrate stage 16 for performing scanning exposure in the section indicated by the driving distance Δd is unnecessary, and therefore, the driving distance Δd of the substrate stage 16 can be shortened.

In this embodiment, a second driving profile in the exposure section 202, which is formed by a half period (a phase of 0 to π) of a sine wave, and a first driving profile in a non-exposure section 203 are connected at a timing at which the exposure slit is located outside the substrate, thereby shortening the driving distance Δd. In other words, the phase at which the first driving profile and the second driving profile are connected is changed in accordance with (information about) the size of a shot region such that the driving time of the substrate stage 16 in the exposure section is shortened, thereby determining the driving profile. Here, the information about the size of a shot region includes at least information representing the length of the shot region in the scanning direction. In this embodiment, a case where the second driving profile in the exposure section is formed by a part of a sine wave will be described as an example. However, the present invention is not limited to this. For example, the second driving profile in the exposure section may be formed by a curve including a function of a second order or higher.

If the phase at which the second driving profile in the exposure section 202 and the first driving profile in the non-exposure section 203 are connected is changed, a driving profile shown in the graph GP4 is obtained, and the driving distance Δd can be shortened. Referring to the graph GP4, in the scanning exposure of the shot region S3, the second driving profile in an exposure section 502 is connected to the first driving profile in a non-exposure section 503 at a phase (<π) equal to or less than the half period of the sine wave.

Also, in the scanning exposure of the shot region S4, as shown in the graph GP3, the first driving profile in a non-exposure section 204 and the second driving profile in the exposure section 205 are connected not at the phase of 0 but at a phase larger than 0, thereby shortening the driving distance Δd. In the scanning exposure of the shot region S4, the first driving profile in a non-exposure section 504 and the second driving profile in an exposure section 505 are connected at a phase larger than 0, thereby obtaining the driving profile shown in the graph GP4.

In this embodiment, the driving profile (the phase at which the first driving profile and the second driving profile are connected) for the shot region N that is the exposure target is determined by the control unit 20 until scanning exposure of a shot region N−2 is ended. Alternatively, the driving profile (the phase at which the first driving profile and the second driving profile are connected) for each shot region may be determined in advance before the start of scanning exposure of the substrate 15.

As described above, in this embodiment, since the driving distance (driving time) of the substrate stage 16 required for scanning exposure is shortened by determining the optimum driving profile for each shot region on the substrate, productivity can further be improved. Note that the method of changing, for each shot region on the substrate, the phase at which the first driving profile in the non-exposure section and the second driving profile in the exposure section are connected has an advantage that the same point in each shot region can be scanned and exposed at the same acceleration. For example, when acceleration in scanning exposure of the center of each shot region is set to zero, an advantage can be obtained when performing various kinds of correction.

Also, in this embodiment, it can also be said that the driving distance of the substrate stage 16 in the scanning direction when exposing a partial field shot region is made shorter than the driving distance of the substrate stage 16 in the scanning direction when exposing a full field shot region. Hence, a form in which a driving profile that implements such driving of the substrate stage 16 is acquired from an external apparatus or the like, and the substrate 15 is exposed while driving the substrate stage 16 based on the driving profile also forms an embodiment of the present invention. Here, the partial field shot region can be considered as a shot region whose length in the scanning direction is shorter than a predetermined reference length. As the reference length, for example, the length of a full field shot region in the scanning direction is set.

Also, if the first driving profile in the non-exposure section and the second driving profile in the exposure section are connected at a phase other than zero or π, the differential value of the acceleration profile may be discontinuous, and the control accuracy of the substrate stage 16 may lower. In this case, the phase at which the first driving profile in the non-exposure section and the second driving profile in the exposure section are connected is determined in consideration of the settling time of the substrate stage 16. Note that the first driving profile in the non-exposure section may be changed such that discontinuous points of the differential value of the acceleration profile become small (smooth).

Second Embodiment

Figure 7:
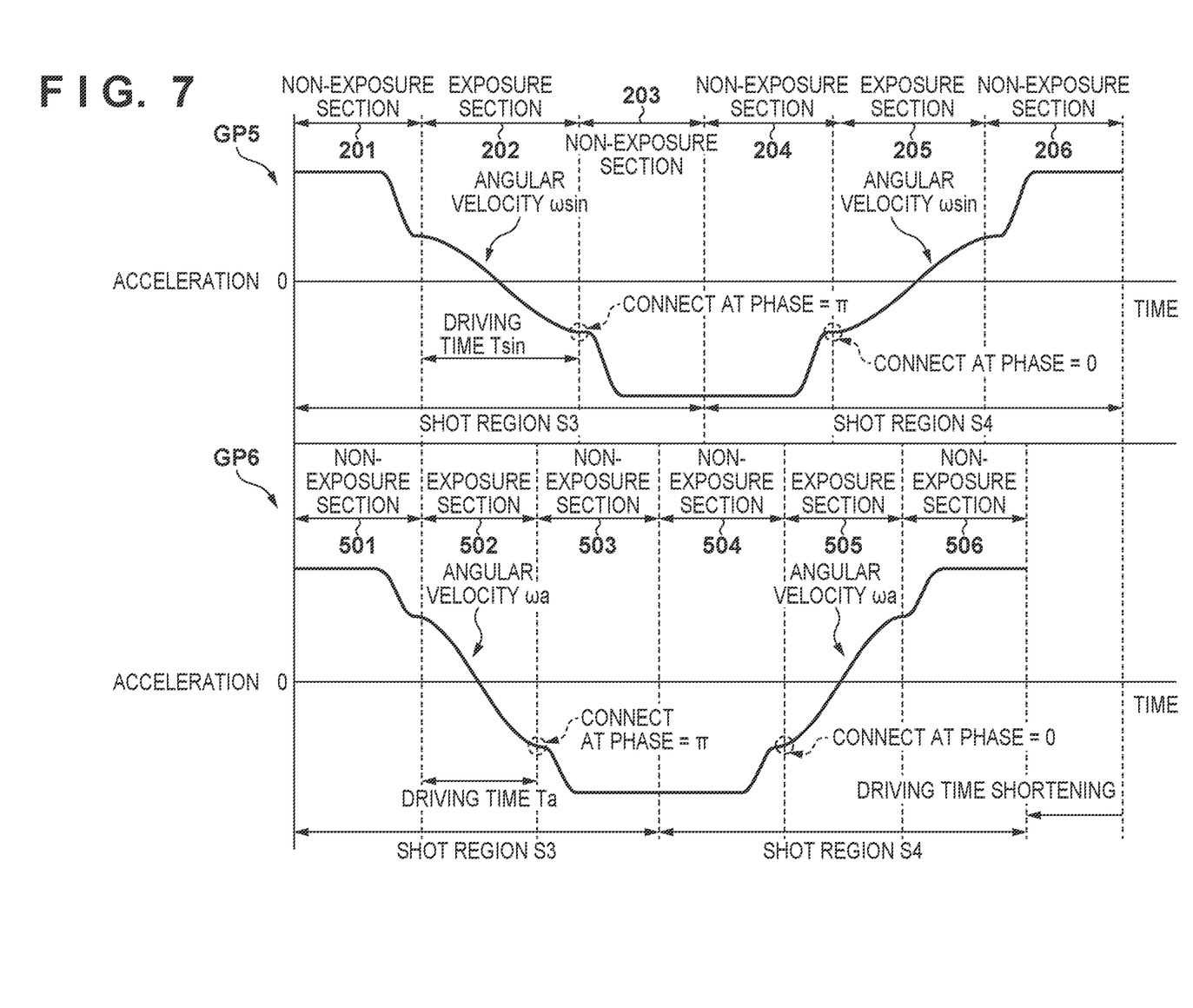
FIG. 7 is a view showing examples of the driving profile of a substrate stage.

A method of determining an optimum driving profile for each shot region on a substrate in the second embodiment will be described with reference to FIGS. 5A, 5B, and 7. FIG. 7 is a view showing examples of the driving profile of a substrate stage 16 in correspondence with the moving loci shown in FIGS. 5A and 5B. In FIG. 7, a graph GP5 (a graph on the upper side) shows a driving profile (acceleration profile) corresponding to the moving locus shown in FIG. 5A, and a graph GP6 (a graph on the lower side) shows a driving profile (acceleration profile) corresponding to the moving locus shown in FIG. 5B.

In this embodiment, an angular velocity ω sin of the driving profile (a driving profile formed by a part of a sine wave) in exposure sections 202 and 205 of the driving profile shown in the graph GP5 is changed, thereby obtaining the driving profile shown in the graph GP6. In the driving profile shown in the graph GP6, an angular velocity ωa (>ω sin) of the driving profile in exposure sections 502 and 505 is changed in accordance with (information about) the sizes of shot regions S3 and S4. The angular velocity ωa of the driving profile in the exposure sections 502 and 505 (the driving profile formed by a part of a sine wave) is calculated by phase π/driving time Ta of substrate stage 16 in exposure sections 502 and 505. The driving time Ta is calculated by (shot field angle Yd of shot regions S3 and S4+slit size Yslit of exposure slit−driving distance Δd)/ average speed Vave of substrate stage 16 in exposure sections 502 and 505. In addition, when determining the angular velocity ωa, a frequency lower than the natural frequency of the substrate stage 16 is set.

In this embodiment, (the angular velocity of the sine wave that forms) a second driving profile for a shot region N that is the exposure target is determined by a control unit 20 until scanning exposure of a shot region N−2 is ended. Alternatively, (the angular velocity of the sine wave that forms) the second driving profile for each shot region may be determined in advance before the start of scanning exposure of a substrate 15.

The method of changing the angular velocity of the sine wave that forms the second driving profile in accordance with the size of the shot region that is the exposure target has an advantage that the first driving profile and the second driving profile can be connected at a phase of 0 or π. Hence, the differential value of an acceleration profile never does not become discontinuous, and stable stage control can be implemented.

As described above, in this embodiment, since the driving distance (driving time) of the substrate stage 16 required for scanning exposure is shortened by determining the optimum driving profile for each shot region on the substrate, productivity can further be improved.

Third Embodiment

A method of determining an optimum driving profile for each shot region on a substrate in the third embodiment will be described with reference to FIGS. 4, 8A, 8B, and 9.

Referring to FIG. 4, in this embodiment, focus is placed on a shot region S84 of shot number 84 and a shot region S85 of shot number 85. The shot regions S84 and S85 have a positional relationship including a line feed section as a non-exposure section when performing scanning exposure of these. Here, the line feed section is a section where a substrate stage 16 is driven to expose the shot region (S85) arrayed on the second row different from the first row after the shot region (S84) arranged on the first row is exposed in a plurality of shot regions on a substrate. Since the shot region S85 is a partial field shot region (peripheral shot region) with a partial region located outside the substrate, there is room to shorten the driving distance (time) of the substrate stage 16.

Figures 8A, 8B:
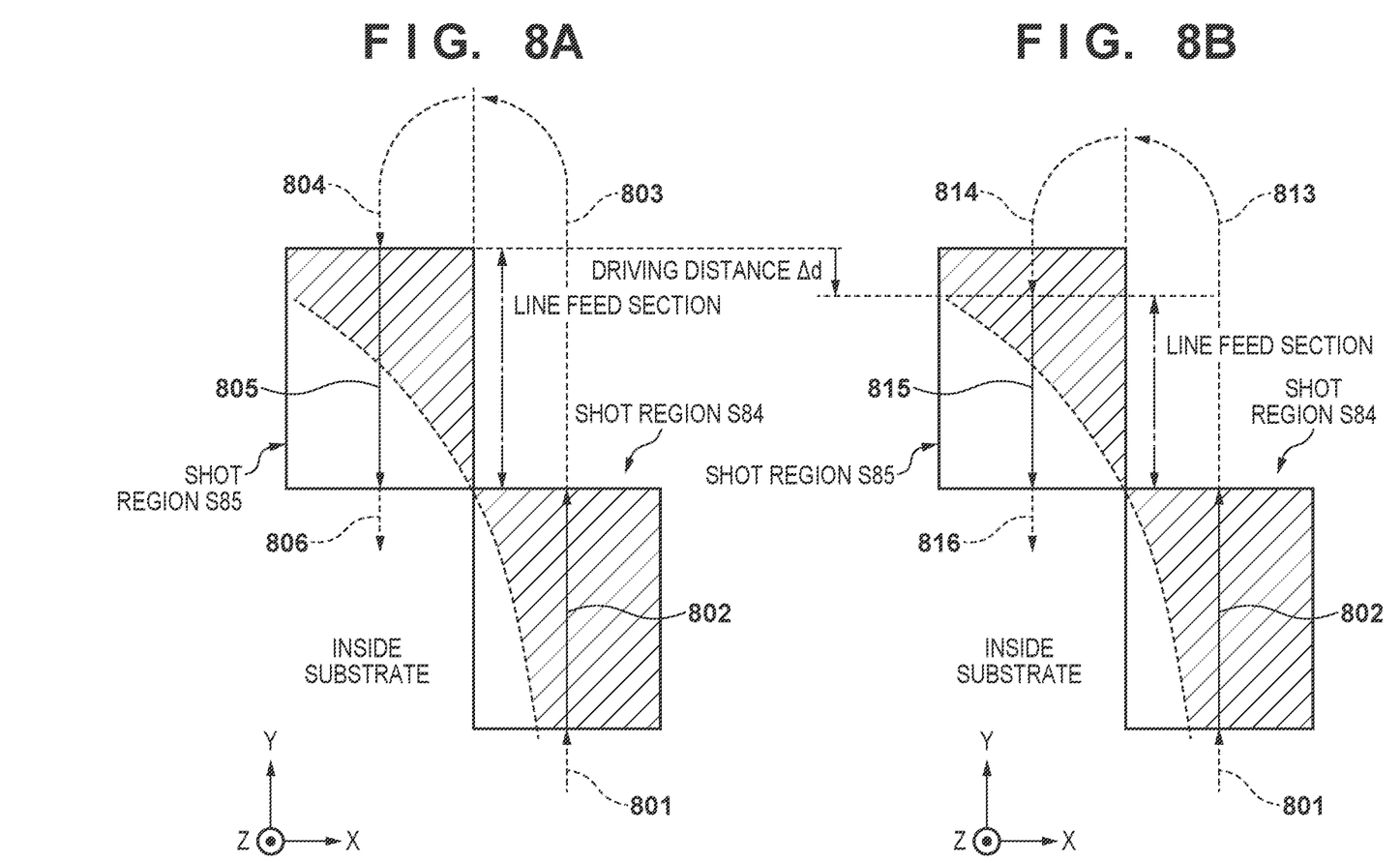
FIGS. 8A and 8B are views showing moving loci of an exposure slit.
Figure 9:
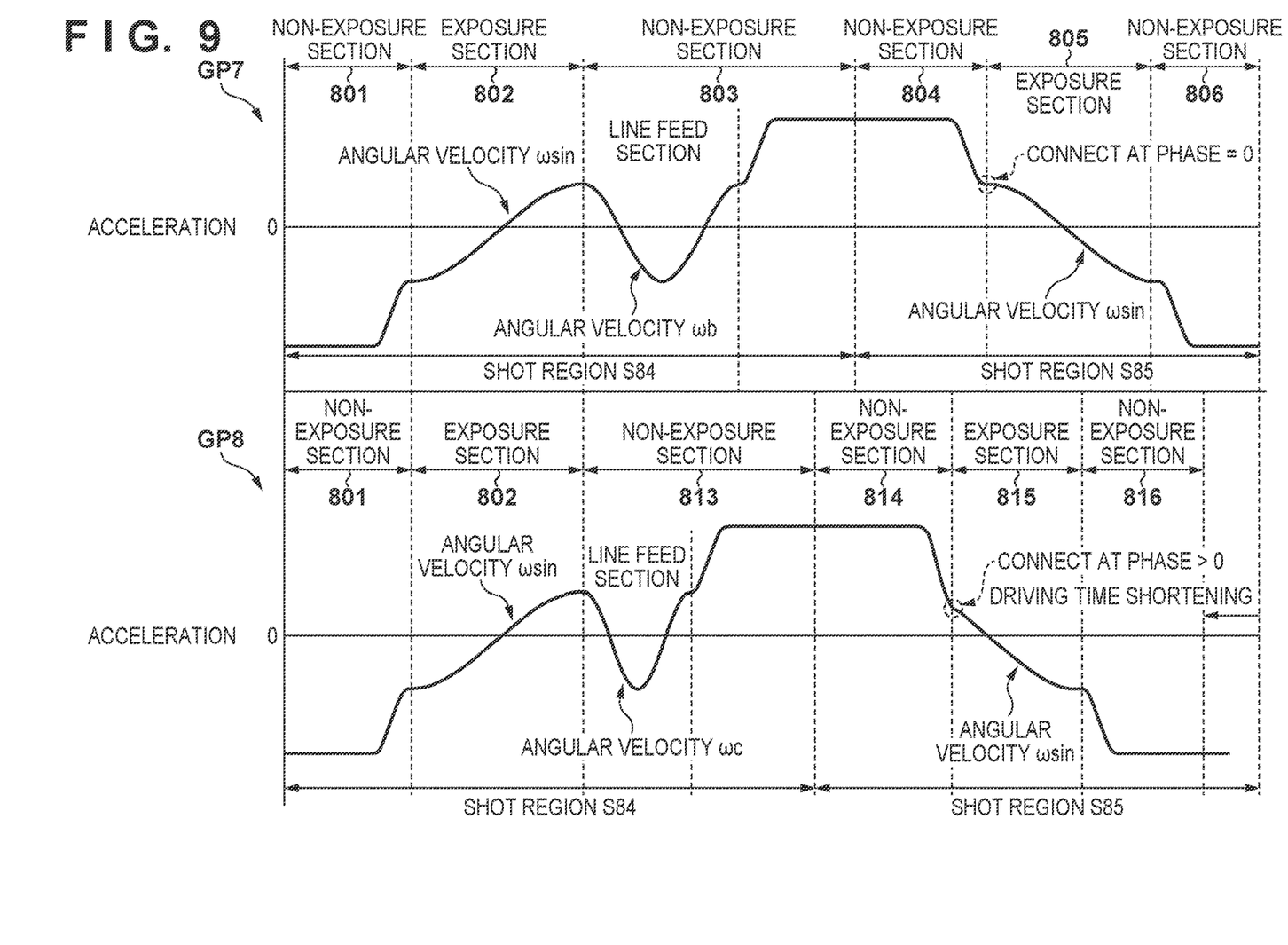
FIG. 9 is a view showing examples of the driving profile of a substrate stage.

FIG. 8A is a view showing the moving locus of an exposure slit in a case where scanning exposure of the shot regions S84 and S85 is performed while driving the substrate stage 16 based on a conventional driving profile. FIG. 8B is a view showing the moving locus of an exposure slit in a case where scanning exposure of the shot regions S84 and S85 is performed while driving the substrate stage 16 based on a driving profile determined from the sizes of the shot regions S84 and S85 in this embodiment. FIG. 9 is a view showing examples of the driving profile of the substrate stage 16 in correspondence with the moving loci shown in FIGS. 8A and 8B. In FIG. 9, a graph GP7 (a graph on the upper side) shows a driving profile (acceleration profile) corresponding to the moving locus shown in FIG. 8A, and a graph GP8 (a graph on the lower side) shows a driving profile (acceleration profile) corresponding to the moving locus shown in FIG. 8B.

Referring to FIG. 9 (graphs GP7 and GP8), in a non-exposure section 801 and an exposure section 802, the substrate stage 16 is driven based on the conventional driving profile. A non-exposure section 803 includes a line feed section formed by a sine wave of one period (a phase of 0 to 2π), a section where the acceleration is changed up to a desired acceleration using a function of a first order or higher, and a constant acceleration section, and is formed by a combination of three driving profiles corresponding to these.

In (the region of) the shot region S85 (outside the substrate) that is the next exposure target, it is unnecessary to perform scanning exposure of the whole region, like a full field shot region. Hence, the driving distance of the substrate stage 16 can be shortened by a driving distance Δd. Along with this, the driving distance of the substrate stage 16 in the line feed section can also be shortened by the driving distance Δd.

In a non-exposure section 813 including the line feed section, an angular velocity ωb of the driving profile in the non-exposure section 803 is changed to an angular velocity ωc (ωb<ωc), thereby shortening the driving distance of the substrate stage 16 in the line feed section. In addition, when determining the angular velocity ωc, a frequency lower than the natural frequency of the substrate stage 16 is set.

(The angular velocity of a sine wave that forms) a first driving profile in the line feed section for a shot region N that is the exposure target is determined by a control unit 20 until scanning exposure of a shot region N−2 is ended. Alternatively, (the angular velocity of the sine wave that forms) the first driving profile in the line feed section for each shot region may be determined in advance before the start of scanning exposure of a substrate 15.

In this embodiment, the angular velocity of the sine wave that forms the first driving profile in the line feed section is changed. Instead of changing the angular velocity, the phase at which the first driving profile and the second driving profile are connected may be changed, as in the first embodiment. The first driving profile in the line feed section may be formed not by a sine wave but by a function of a first order or higher and a constant acceleration section, and the profile in the function of the first order or higher and the constant acceleration section may be determined in accordance with the driving distance in the line feed section.

In scanning exposure of the shot region S85, as in the first embodiment, the first driving profile in a non-exposure section 804 and the second driving profile in an exposure section 805 are connected not at the phase 0 but at phase larger than 0, thereby shortening the driving distance Δd. When the first driving profile in the non-exposure section 804 and the second driving profile in the exposure section 805 are connected at the phase larger than 0, the driving profile shown in the graph GP8 is obtained. Referring to the graph GP8, in the scanning exposure of the shot region S85, the second driving profile in an exposure section 815 is connected to the first driving profile in a non-exposure section 814 at the phase larger than 0.

In this embodiment, a case where the phase at which a driving profile is connected to the driving profile in the exposure section 815 (the second driving profile formed by a part of a sine wave) is changed has been described. However, the present invention is not limited to this. For example, as in the second embodiment, the angular velocity of the sine wave that forms the driving profile in the exposure section 815 may be changed.

As described above, in this embodiment, the first driving profile in the non-exposure section and the second driving profile in the exposure section are determined for each shot region on the substrate. Hence, since the driving distance (driving time) of the substrate stage 16 required for scanning exposure is shortened, productivity can further be improved.

Fourth Embodiment

Figure 10:
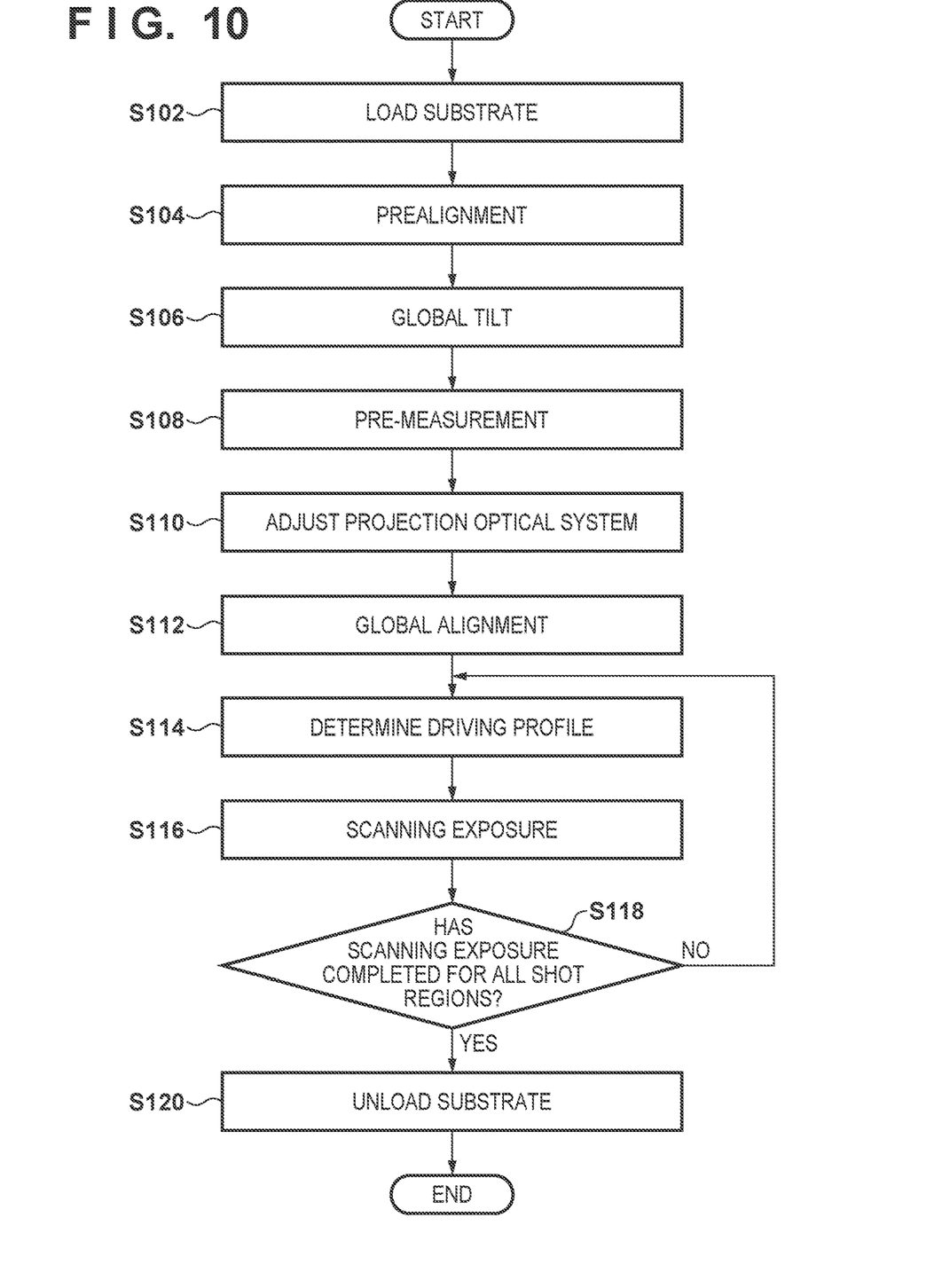
FIG. 10 is a flowchart for explaining exposure processing in the exposure apparatus shown in FIG. 1.

An operation of an exposure apparatus 100, that is, exposure processing (exposure method) will be described with reference to FIG. 10. The exposure processing is performed by a control unit 20 comprehensively controlling each unit of the exposure apparatus 100, as described above.

In step S102, a substrate 15 is loaded into the exposure apparatus 100. More specifically, the substrate 15 is conveyed by a conveyance hand (not shown), and a substrate stage 16 is caused to hold the substrate 15.

In step S104, prealignment (premeasurement and correction) for global alignment is performed. More specifically, a deviation amount such as a rotation error of the substrate 15 is measured using a low-power visual field alignment optical system (not shown) and corrected such that an alignment mark on the substrate is fitted in the measurement range of a high-power visual field alignment optical system (not shown) used in global alignment.

In step S106, global tilt is performed. More specifically, the surface heights (surface positions) of the substrate at a plurality of measurement points are measured using a surface position measurement unit 17. The tilt of the entire substrate 15 is calculated and corrected based on the surface positions measured by the surface position measurement unit 17.

In step S108, pre-adjustment for measuring the surface position of the substrate 15 in real time in scanning exposure is performed. The pre-adjustment includes, for example, adjustment of the light amount of the light source of the surface position measurement unit 17 and storage of a pattern step (pattern offset) in a shot region on the substrate.

In step S110, a projection optical system 14 is adjusted. More specifically, using a light amount sensor and a reference mark (not shown) arranged on the substrate stage 16 and a reference plate (not shown) arranged on an original stage 13, the tilt and the field curvature of the projection optical system 14 are obtained. For example, the change of the amount of exposure light when the substrate stage 16 is driven in the X, Y, and Z directions is measured by the light amount sensor arranged on the substrate stage 16. Then, based on the change of the amount of the exposure light, a deviation amount of the reference mark with respect to the reference plate is obtained, thereby adjusting the projection optical system 14.

In step S112, global alignment is performed. More specifically, an alignment mark on the substrate is detected using the high-power visual field alignment optical system (not shown), and the deviation amount of the entire substrate 15 and a deviation amount common to the shot regions are obtained. To detect the alignment mark at a high accuracy, the alignment mark needs to be located at a position (best contrast position) where the contrast of the alignment mark is the best contrast. To measure the best contrast position, the surface position measurement unit 17 and an alignment optical system are used. For example, driving the substrate stage 16 to a predetermined height (Z-direction position), measuring the contrast by the alignment optical system, and measuring the surface position of the substrate 15 by the surface position measurement unit 17 are repeated. At this time, the measurement result of the contrast according to each Z-direction position of the substrate stage 16 and the measurement result of the surface position of the substrate 15 are stored in association with each other. Based on a plurality of contrast measurement results, the Z-direction position of the substrate stage 16 at which the contrast is highest is obtained as the best contrast position.

In step S114, the driving profile of the substrate stage 16 when performing scanning exposure of each shot region on the substrate is determined (first step). As described above, the driving profile is formed by connecting a first driving profile in a non-exposure section that does not include an exposure section where a shot region is exposed and second driving profile in the exposure section. More specifically, as described in the first to third embodiments, for each of a plurality of shot regions on the substrate 15, the driving profile (the first driving profile and the second driving profile) is determined based on information about the size of the shot region.

In step S116, scanning exposure of the shot region that is the exposure target on the substrate 15 is performed (second step). More specifically, scanning exposure of the shot region on the substrate 15 is performed while driving (accelerating/decelerating) the substrate stage 16 based on the driving profile determined in step S114. At this time, focus/leveling drive of the substrate stage 16 is performed while measuring the surface position of the shot region on the substrate 15 in real time using the surface position measurement unit 17, thereby implementing exposure on the best focus plane.

In step S118, it is determined whether scanning exposure for all shot regions on the substrate 15 is completed. If scanning exposure for all shot regions on the substrate 15 is not completed, the process returns to step S114 to repeat steps S114 and S116. On the other hand, if scanning exposure for all shot regions on the substrate 15 is completed, the process advances to step S120.

In step S120, the substrate 15 is unloaded from the exposure apparatus 100. More specifically, the substrate 15 with all shot regions exposed is received from the substrate stage 16 by a conveyance hand (not shown) and conveyed to the outside of the exposure apparatus 100.

According to exposure processing of this embodiment, it is possible to shorten the driving distance (driving time) of the substrate stage 16 required for scanning exposure of each shot region on the substrate 15 and thus improve productivity.

Fifth Embodiment

An article manufacturing method according to the embodiment of the present invention is suitable for manufacturing an article, for example, a flat panel display, a liquid crystal display element, a semiconductor element, or a MEMS. The manufacturing method includes a step of exposing a substrate with a photoresist applied thereon using the above-described exposure apparatus 100 (exposure processing), and a step of developing the exposed photoresist. In addition, an etching step and an ion implantation step are performed for the substrate using the pattern of the developed photoresist as a mask, thereby forming a circuit pattern on the substrate. The steps of exposure, development, and etching are repeated, thereby forming a circuit pattern formed by a plurality of layers on the substrate. In a post-process, dicing (processing) is performed for the substrate with the circuit pattern formed thereon, thereby performing mounting, bonding, and inspection steps of the chip. The manufacturing method also includes other known processes (oxidation, deposition, vapor deposition, doping, planarization, resist removal, and the like). The article manufacturing method according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-128386 filed Aug. 10, 2022, which is hereby incorporated by reference herein in its entirety.

What is claimed is:

1. An exposure apparatus for scanning and exposing a plurality of shot regions on a substrate, comprising:
   a stage configured to hold and drive the substrate; and
   a control unit configured to control driving of the stage based on a first acceleration profile used for an acceleration of the stage in a non-exposure section and a second acceleration profile used for the acceleration of the stage in an exposure section in which a shot region among the plurality of shot regions is exposed,
   wherein the second acceleration profile includes a part of a sine wave, and
   the control unit controls the driving of the stage for each of the plurality of shot regions by using the second acceleration profile in which at least one of an angular velocity of the sine wave and a phase of the sine wave at which the first acceleration profile and the second acceleration profile are connected, is determined based on information about a size of the shot region.

2. The apparatus according to claim 1, wherein the control unit controls the driving of the stage by using the first acceleration profile and the second acceleration profile determined such that a driving distance of the stage in the exposure section becomes a distance according to the size, for each of the plurality of shot regions.

3. The apparatus according to claim 2, wherein the control unit controls the driving of the stage by using the first acceleration profile and the second acceleration profile determined such that a driving time of the stage in the exposure section is shortened.

4. The apparatus according to claim 1, wherein the phase of the sine wave at which the first acceleration profile and the second acceleration profile are connected is a phase other than zero or $\pi$.

5. The apparatus according to claim 1, wherein the angular velocity of the sine wave is a frequency lower than a natural frequency of the stage.

6. The apparatus according to claim 1, wherein the information includes information representing a length of the shot region in a scanning direction.

7. The apparatus according to claim 6, wherein the plurality of shot regions includes a first shot region whose length in the scanning direction equals to or greater than a reference length and a second shot region whose length in the scanning direction is shorter than the reference length, and
   the second acceleration profile is determined so that a driving distance of the stage in the scanning direction when the second shot region is exposed is shorter than a driving distance of the stage in the scanning direction when the first shot region is exposed.

8. The apparatus according to claim 7, wherein the reference length is a length in the scanning direction of a shot region in which an entire region of the shot region is located inside a periphery of the substrate.

9. The apparatus according to claim 1, wherein the plurality of shot regions includes a first shot region and a second shot region smaller than the first shot region,
   the second acceleration profile of the first shot region includes the sine wave of half a period, and the second acceleration profile of the second shot region includes the sine wave of less than half a period.

10. The apparatus according to claim 9, wherein the first shot region located inside a periphery of the substrate, the second shot region located at the periphery of the substrate.

11. The apparatus according to claim 1, wherein the control unit controls an exposure amount in accordance with a speed of the stage.

12. The apparatus according to claim 1, wherein a same point in each shot region of the plurality of shot regions exposed at a same acceleration.

13. The apparatus according to claim 1, wherein
   the first acceleration profile includes a part of a first sine wave, is a profile corresponding to a line feed section in which the stage is driven to expose a shot region arrayed on a second row different from a first row after a shot region arranged on the first row is exposed the plurality of shot regions, and
   the control unit controls the driving of the stage by using the first acceleration profile and the second acceleration profile, in which at least one of an angular velocity of the first sine wave, and a phase of a second sine wave included in the second acceleration profile at which the first acceleration profile are connected, is determined so that a driving distance in a scanning direction of the stage is short.

14. An exposure method for scanning and exposing a plurality of shot regions on a substrate, comprising:
   determining a driving profile for driving of a stage configured to hold the substrate; and
   exposing the plurality of shot regions while driving the stage based on the driving profile,
   wherein the driving profile includes a first acceleration profile used for an acceleration of the stage in a non-exposure section and a second acceleration profile used for the acceleration of the stage in an exposure section in which a shot region among the plurality of shot regions is exposed,
   the second acceleration profile is formed by a curve includes a part of a sine wave, and
   in the determining the driving profile, at least one of an angular velocity of the sine wave and a phase of the sine wave at which the first acceleration profile and the second acceleration profile are connected, is determined based on information about a size of the shot region.

15. An article manufacturing method comprising:
   exposing a substrate using an exposure method defined in claim 14;
   developing the exposed substrate; and
   manufacturing an article from the developed substrate.

* * * * *